United States Patent
Hu et al.

(10) Patent No.: US 12,140,632 B2
(45) Date of Patent: Nov. 12, 2024

(54) DEVICE UNDER TEST SYNCHRONIZATION WITH AUTOMATED TEST EQUIPMENT CHECK CYCLE

(71) Applicant: Synopsys, Inc., Mountain View, CA (US)

(72) Inventors: Yongkang Hu, Xi'an (CN); Ramalingam Kolisetti, Karempudi (IN); Anubhav Sinha, Hyderabad (IN); Abhijeet Samudra, Santa Clara, CA (US)

(73) Assignee: Synopsys, Inc., Sunnyvale, CA (US)

( * ) Notice: Subject to any disclaimer, the term of this patent is extended or adjusted under 35 U.S.C. 154(b) by 436 days.

(21) Appl. No.: 17/455,237

(22) Filed: Nov. 17, 2021

(65) Prior Publication Data
US 2022/0155370 A1    May 19, 2022

Related U.S. Application Data

(60) Provisional application No. 63/114,798, filed on Nov. 17, 2020.

(51) Int. Cl.
*G01R 31/319*   (2006.01)
*G01R 31/317*   (2006.01)
*G01R 31/3183*  (2006.01)

(52) U.S. Cl.
CPC . *G01R 31/31908* (2013.01); *G01R 31/31726* (2013.01); *G01R 31/318307* (2013.01); *G01R 31/31922* (2013.01)

(58) Field of Classification Search
CPC ........ G01R 31/31908; G01R 31/31726; G01R 31/318307; G01R 31/31922; G01R 31/31937
See application file for complete search history.

(56) References Cited

U.S. PATENT DOCUMENTS

| | | | |
|---|---|---|---|
| 2007/0089009 A1* | 4/2007 | Nishizawa | G01R 31/31715 714/738 |
| 2007/0296476 A1 | 12/2007 | Hessen-Schmidt | |
| 2008/0015798 A1* | 1/2008 | Bullock | G01R 31/31718 702/57 |
| 2011/0087942 A1* | 4/2011 | Conner | G01R 31/31908 714/738 |

(Continued)

OTHER PUBLICATIONS

J. Hops, B. Swing, B. Phelps, B. Sudweeks, J. Pane and J. Kinslow, "Non-deterministic DUT behavior during functional testing of high speed serial busses: challenges and solutions," 2004 International Conferce on Test, Charlotte, NC, USA, 2004, pp. 190-196, (Year: 2004).*

(Continued)

*Primary Examiner* — Cynthia Britt
(74) *Attorney, Agent, or Firm* — Patterson + Sheridan, LLP

(57) ABSTRACT

Systems, integrated circuits and methods for synchronizing testing a Device under test (DUT) with an automated test equipment (ATE) is provided. In one example, a method includes transmitting a test packet from an ATE to a first Device Under Test DUT; receiving, at the ATE from the DUT, a result packet; and in response to receiving a Start of Packet (SOP) indicator from the DUT at the ATE, evaluating the first DUT by comparing the result packet to an expected packet associated with the test packet.

19 Claims, 6 Drawing Sheets

(56) References Cited

U.S. PATENT DOCUMENTS

| | | | |
|---|---|---|---|
| 2015/0067426 A1* | 3/2015 | Nardini | G01R 31/318385 |
| | | | 714/727 |
| 2016/0227004 A1* | 8/2016 | Conner | H04L 7/0041 |
| 2020/0355743 A1* | 11/2020 | Lim | G06F 13/4282 |
| 2021/0055347 A1* | 2/2021 | Pöppe | G06F 11/2733 |
| 2023/0152374 A1* | 5/2023 | Sauer | G01R 13/0254 |
| | | | 714/724 |

OTHER PUBLICATIONS

A. T. Sivaram, M. Shimanouchi, H. Maassen and R. Jackson, "Tester architecture for the source synchronous bus," 2004 International Conferce on Test, Charlotte, NC, USA, 2004, pp. 738-747, (Year: 2004).*

Venkataramani, et al., "Test-Time Reduction in ATE Using Asynchronous Clocking" Semantic Scholar Published 2012.

* cited by examiner

DEVICE UNDER TEST SYNCHRONIZATION WITH AUTOMATED TEST EQUIPMENT CHECK CYCLE

CROSS-REFERENCES TO RELATED APPLICATIONS

The present disclosure claims priority to U.S. Provisional Patent Application 63/114,798 filed Nov. 17, 2020, entitled "DEVICE UNDER TEST SYNCHRONIZATION WITH AUTOMATED TEST EQUIPMENT CHECK CYCLE", which is incorporated herein by reference in its entirety.

TECHNICAL FIELD

The present disclosure generally relates to a test automation system for an electronic device, and more particularly, to a system and method for providing device under test synchronization with automated test equipment check cycle.

BACKGROUND

Automated test equipment (ATE) perform various tests on a device under test (DUT) for production quality assurance by supplying a test pattern to the DUT and comparing the response from the DUT against a predefined expected output from the DUT. When the ATE identifies that a DUT has provided the expected output based on the test pattern input, that DUT passes the test, otherwise that DUT fails the test.

In production testing using the same test pattern on several dies across a wafer, the response data may drift across clock cycles between different dies. For example, the test data from a second die may arrive at the ATE one clock cycle early or one clock cycle later than for a second die. Although both the first die and the second die report the same output pattern to the ATE, the clock drift causes a conflict with the requirement for the ATE that the data be deterministic, thus resulting in at least one of the dies failing the test that it would have passed test if the clock drift were not present.

SUMMARY

Described herein are improvements to device testing that enable different DUTs to synchronize with an ATE, such reducing false DUT test results associated with clock mismatches between the DUTs and the ATE. The improvements include systems, integrated circuits and methods for synchronizing testing of the DUT with the ATE.

In one example, a method includes transmitting a test packet from an ATE to a first DUT; receiving, at the ATE from the DUT, a result packet; and in response to receiving a Start of Packet (SOP) indicator from the DUT at the ATE, evaluating the first DUT by comparing the result packet to an expected packet associated with the test packet.

In another example, a system is provided that includes a processor and a memory. The memory stores instructions, that when executed by the processor, cause the processor to: transmit a test packet from an ATE to a DUT; transmit a clock signal from the ATE to the DUT; receive, at the ATE, a result packet from the DUT; delay evaluation of the result packet until the ATE receives a Start of Packet (SOP) indicator from the DUT, wherein the SOP indicator is transmitted separately from the result packet by the DUT to the ATE; and evaluate the DUT by comparing the result packet to an expected packet associated with the test packet starting when indicated by the SOP indicator.

In another example, an integrated circuit is provided that includes test circuitry communicatively coupled to control circuitry on a common substrate. The control circuitry is configured to: receive a test packet and a clock signal from an ATE; provide test circuitry of a DUT associated with the control circuitry with the test packet and a clock signal from the control circuitry; generate a result packet based on the test packet provided to the DUT; generate, by the control circuitry, an SOP indicator; and transmit, by the control circuitry, the SOP and the result packet to the ATE.

In another example, a method is provided that includes: receiving, by control circuitry of a SoC, a test packet and a clock signal from an ATE; providing test circuitry of a DUT residing in the SoC with the test packet and a clock signal from the control circuitry; generating a result packet based on the test packet provided to the DUT; generating, by the control circuitry of the SoC, an SOP indicator; and transmitting, by the control circuitry of the SoC, the SOP and the result packet to the ATE.

In yet another example, a computer readable storage apparatus is provided that stores instructions, that when executed by a processor, cause the processor to perform operations that includes: transmitting a test packet from an ATE to a DUT; transmitting a clock signal from the ATE to the DUT; receiving, at the ATE from the DUT, a result packet; receiving, at the ATE from the DUT, a Start of Packet (SOP) indicator based on an asynchronous response clock for the DUT processing the test packet; adjusting a time window to evaluate the DUT based on the SOP indicator; and evaluating the DUT by comparing the result packet during the time window to an expected packet associated with the test packet.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

ATE's can inadvertently identify a DUT as a failure particularly when a second DUT is different than a previously tested first DUT. This is often the case where clock drift or other differences cause the packets received by the ATE from the second DUT to be one or more bits earlier or one or more bits later than the packets for the first DUT. Addressing this problem via improvements to the ATE would be very costly and design intensive. Thus, as disclosed below is a cost effective and robust DUT-based solution that enables ATEs to be utilized while reducing inadvertent error flags when testing different DUTs.

Embodiments of the present disclosure relate to improvements to device testing that enable a DUT to synchronize with an ATE's check cycle, thus allowing the DUT to overcome problems associated with clock drift during test. The check cycle of the ATE recognizes that the data returning from the DUT is ready for analysis by the ATE. During test, the ATE supplies a clock signal to the DUT to perform the various test operations, and the DUT sends the clock signals back to the ATE. The check cycle of ATE uses the returned clock signals as a gating mechanism so that the ATE only checks the output of the DUT when the returned clock signal is available, thus compensating for any clock drift between the DUT and ATE during test and returning fewer improper fail results for the DUT.

Figure 1A:
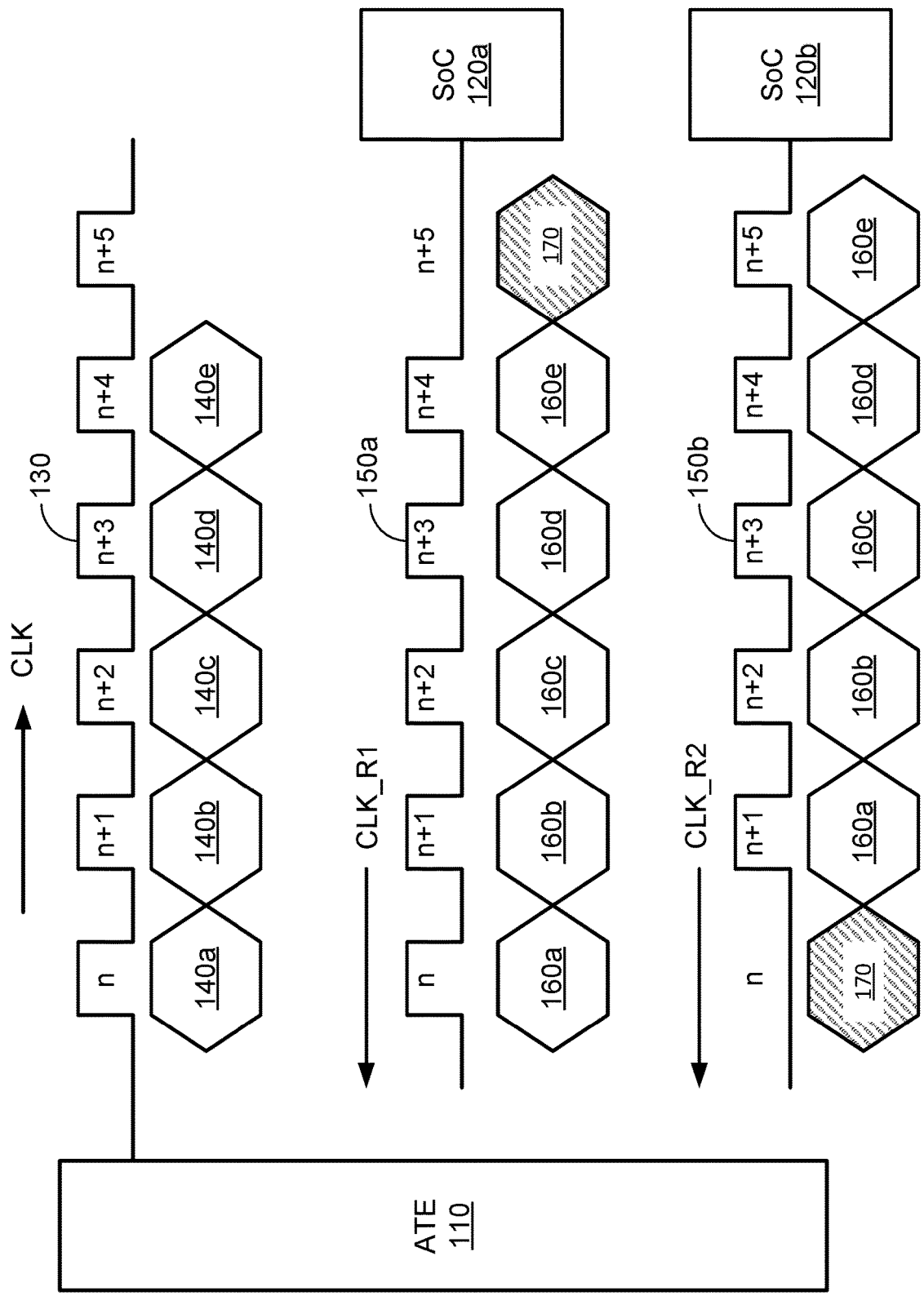
FIG. 1A illustrates data transmission for an ATE testing a first DUT and a second DUT, according to embodiments of the present disclosure.
Figure 1B:
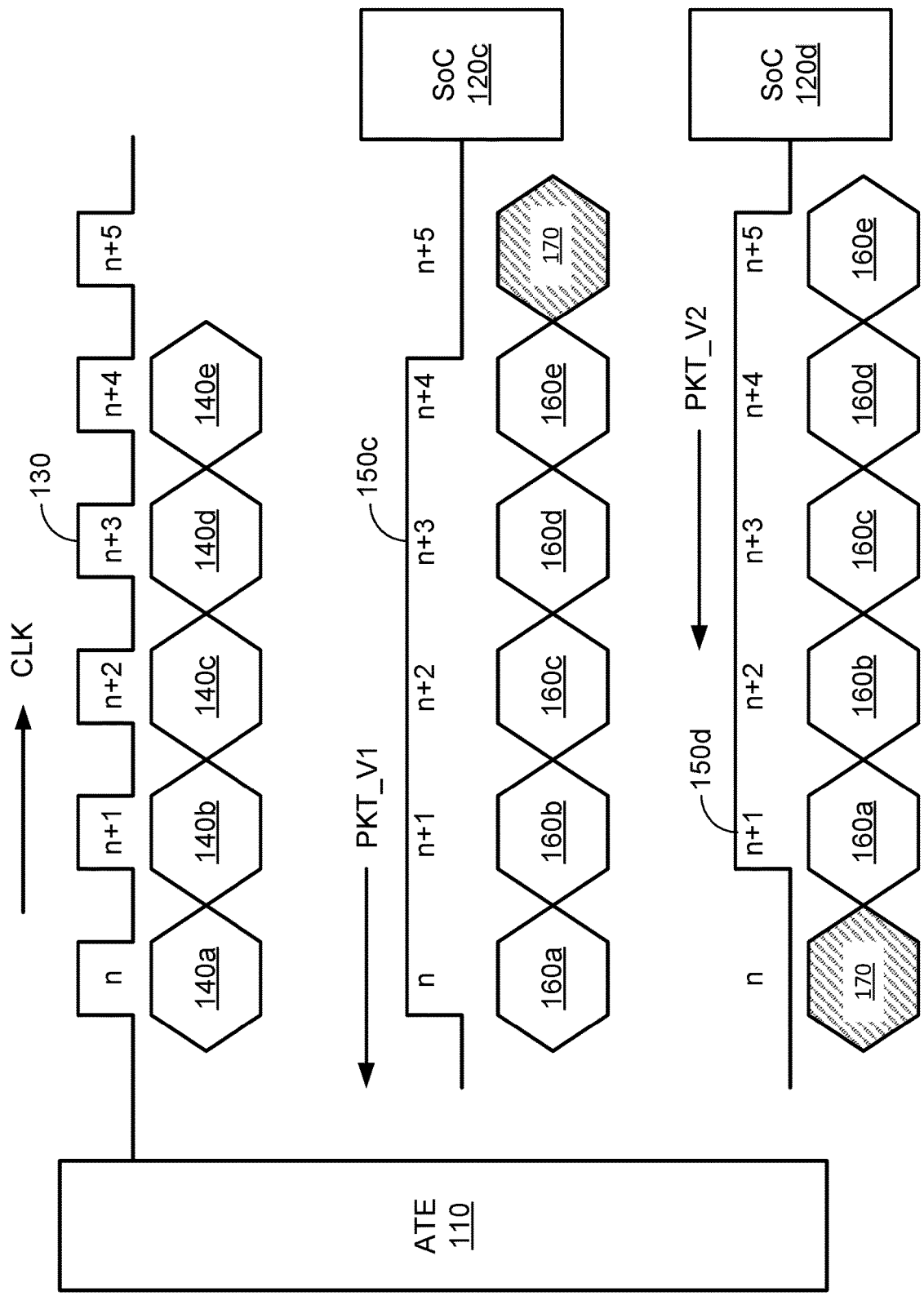
FIG. 1B illustrates data transmission for an ATE testing a third DUT and fourth DUT, according to embodiments of the present disclosure

FIG. 1A illustrates data transmission for an ATE 110 testing a DUT in a first system on a chip (SoC) 120a (generally or collectively, SoC 120) and a second SoC 120b, according to embodiments of the present disclosure. FIG. 1B illustrates data transmission for an ATE 110 testing a third SoC 120c and a fourth SoC 120d, according to embodiments of the present disclosure. In each of FIG. 1A and FIG. 1B, the ATE 110 sends a clock signal 130 (CLK) and a series of logical inputs 140a-140e to the various SoCs 120 including instances of the DUT. In various embodiments, the DUTs may be tested sequentially (e.g., first testing a first instance of the DUT in the first SoC 120a, then testing a second instance of the DUT in the second SoC 120b, then testing a third instance of the DUT the third SoC 120c, etc.) or in parallel via an ATE having multiple sockets that enable multiple DUTs to be tested at the same time.

The logical inputs 140a-140e are a pre-defined sequence of logical values (e.g., logical TRUE or logical FALSE) used to evaluate the DUT(s) during test, and may include one or more sets of values sent in parallel to the SoC(s) 120, and may include various sequence lengths with more than or fewer than the illustrated five logical inputs 140a-140e.

The individual DUTs perform various logical operations based on the logical inputs 140a-140e and the provided clock signal 130. These logical operations produce various outputs that the DUTs transmit back to the ATE 110 to evaluate whether the individual DUT passes or fails the test. In the examples illustrated in FIG. 1A and FIG. 1B, the DUTs on each of the four SoCs 120a-d produce a set of logical outputs 160a-160e that are transmitted back to the ATE 110 along with various start of packet (SOP) indicators 150a-d (generally or collectively, SOP indicators 150). Similarly to the logical inputs 140a-140e, the logical outputs 160a-160e are a sequence of logical values (e.g., logical TRUE or logical FALSE) used to evaluate the DUT(s) during test, and may include one or more sets of values sent in parallel to the ATE 110 performing the test and may include various sequence lengths with more than or fewer than the illustrated five logical outputs 160a-160e.

Because the ATE 110 and the DUTs may become desynchronized (e.g., due to processing and transmission delays), the various DUTs may each produce the same set of logical outputs 160a-160e, but are received at different times based on the cycles of the clock signal 130. For example, the DUT of the first SoC 120a in FIG. 1A may provide the logical outputs 160a-160e starting at cycle n, whereas the DUT of the second SoC 120b provides an identical set of logical outputs 160a-160e starting at cycle n+1. Depending on whether the ATE 110 expects to receive at cycle nor cycle n+1, the ATE will evaluate the output of at least one DUT at the wrong cycle and mark that DUT as failing the test and the other DUT as passing the test, despite both DUTs providing the same logical outputs 160a-160e.

For example, when the ATE 110 begins evaluations at cycle n of the clock signal 130 expecting a series of five logical outputs 160, the evaluation of the DUT of the first SoC 120a includes the first through fifth logical outputs 160a-160e, whereas the evaluation of the DUT of the second SoC 120b includes an unknown bit 170 and the first through fourth logical outputs 160a-d. In another example, when the ATE 110 begins evaluations at cycle n+1 expecting a series of five logical outputs 160, the evaluation of the DUT of the first SoC 120a includes the second through fifth logical outputs 160b-160e and an unknown bit 170, whereas the evaluation of the DUT of the second SoC 120b includes the first through fifth logical outputs 160a-e. Accordingly, the sequence provided by a given DUT to the ATE 110 and the sequence evaluated by the ATE 110 may not be the same due to clock drift in the expected time/cycle of receipt.

To account for potential clock drift, the SoCs 120 transmit various SOP indicators 150 to the ATE 110 in conjunction with the logical outputs 160a-160e. In FIG. 1A, the first SoC 120a and the second SoC 120b respectively send copies of (at least a portion of) the clock signal 130 back to the ATE 110 as a first received clock signal (CLK_R1) as a first SOP indicator 150a and a second received clock signal (CLK_R2) as a second SOP indicator 150b. The SOP indicators 150a, 150b are aligned in time with the transmission of the logical outputs 160a-160e from the respective DUT, thus indicating when the ATE 110 should begin analysis of the packets returning from the SoCs 120 that are based on the logical outputs 160a-160e provided by the ATE 100. Accordingly, the first SOP indicator 150a begins at cycle n with the first logical output 160a from the first SoC 120a, and the second SOP indicator 150b begins at cycle n+1 with the first logical output 160a from the second SoC 120b.

The generation of CLK_R1 and/or CLK_R2 may be a phase lock loop (PLL) clock generated based on the test reference clock (CLK) or a clock internal to the SoC 120. In other embodiments, control circuitry of the SoC 120 captures that the response clock (CLK_R) is asynchronous, and can delay the result packet encapsulation to CLK_R generation. For example, the system can wait to receive an indication or setup command (e.g., from a user) whether the ATE 110 is to treat the transmitted clock signal (CLK) and various received clock signals (CLK_R1 and/or CLK_R2) as asynchronous or synchronous. When handling asynchronous clock signals, the asynchronicity can add to the delay of return packet encapsulation, and this delay is mapped to CLK_R1 and/or CLK_R2 generation. In the examples illustrated in FIGS. 1A and 1B, the CLK_R1, CLK_R2, PKT_V1 and PKT_V2 signals are synchronous with the CLK signal 130. In asynchronous examples, the CLK_R1, CLK_R2, PKT_V1 and PKT_V2 signals are offset in time (i.e., to the left or right in FIGS. 1A-1B) relative to the CLK signal 130.

In a synchronous example, the ATE 110 provides the CLK signal 130 and the logical inputs 140 to the control circuitry of the SoC 120. The control circuitry of the SoC 120 utilizes the CLK signal 130 as the system clock for the control circuitry and the DUT of the SoC 120. The control circuitry of the SoC 120 provides the CLK signal 130 and logical inputs 140 to the DUT on the SoC 120. The DUT forwards the clock signal back to control circuitry of the SoC 120, where if necessary, appropriate clock cycles are gated-off by the control circuitry such that the rising edge of the return clock CLK_R provided by the control circuitry to the ATE 110 coincides with the logical outputs 160a-160e from the respective DUT, thus enabling the ATE 110 to accurately compare the logical outputs 160a-160e with expected results (i.e., comparison logic) associated with the logical inputs 140. Stated differently, a high value of the return clock CLK_R is indicative of the outputs 160 being ready for comparison by the ATE 110, while a low value of the return clock CLK_R is indicative that the outputs 160 are not ready for comparison, thus, making the return clock CLK_R both a SOP indicator (when high) and a skip cycle indicator (when low). Therefore, gating off cycles of the return clock CLK_R provides the ATE 110 with a skip cycle indicator that enables synchronicity with the DUT via the return clock signal as in indicator for when to being comparison of the logical outputs 160. In some embodiments, the ATE 110 may use the return clock signal (CLK_R1 and/or CLK_R2) as the clock signal for comparing the return packet to an expected output, while in other embodiments, the ATE 110 uses the internal clock signal (CLK) as the clock signal with the return clock signal (CLK_R1 and/or CLK_R2) being used as an SOP indicator 150.

In an asynchronous example, the ATE 110 also provides the CLK signal 130 and the logical inputs 140 to the control circuitry of the SoC 120. The control circuitry of the SoC 120 utilizes the CLK signal 130 as a reference clock. The control circuitry generates a PPL clock based the CLK signal 130, and provides the PPL clock as a system clock to generate to the DUT of the SoC 120. The PPL clock operates at a higher frequency of than the CLK signal 130. This higher frequency is asynchronous with the CLK signal 130. The control circuitry of the SoC 120 will forward the higher frequency clock CLK_R back to ATE 110, where if necessary, appropriate clock cycles are gated-off by the control circuitry such that the rising edge of the return clock CLK_R provided by the control circuitry to the ATE 110 coincides with the logical outputs 160a-160e from the respective DUT.

In some embodiments, the ATE 110 may use the return clock signal (CLK_R1 and/or CLK_R2) as the clock signal for comparing the return packet to an expected output, while in other embodiments, the ATE 110 uses the internal clock signal (CLK) as the clock signal with the return clock signal (CLK_R1 and/or CLK_R2) being used as an SOP indicator 150.

In FIG. 1B, the third SoC 120c and the fourth SoC 120d respectively send a third SOP indicator 150c and a fourth SOP indicator 150d that begin when the logical outputs 160a-160e from the respective DUT begin. The third SOP indicator 150c indicates one logical value (shown as high/logical TRUE as PKT_V1) when the third SoC 120c is sending the logical outputs 160a-160e, and the other logical value (shown as low/logical FALSE) when the third SoC is not sending the logical outputs 160a-160e. The fourth SOP indicator 150d indicates a logical value for the cycle when the first logical output 160a is sent (shown as high/logical TRUE at cycle n+1 through n+5 as PKT_V2) and otherwise indicate the other logical value (shown as low/logical FALSE at cycle n). Similarly to the returned clock signals (CLK_R1 and/or CLK_R2) described in relation to FIG. 1A, the logical value signals (PKT_V1 and/or PKT_V2) are temporarily aligned with the processes performed in the respective SoCs 120 that generate the logical outputs 160a-160e when the logical outputs 160a-e are transmitted to the ATE 110; either synchronously or asynchronously to the received clock signal 130 (CLK).

As will be appreciated, variations on the implementation of the SOP indicators 150 are contemplated beyond the four examples given herein, including, but not limited to: rising edge indicators, falling edge indicators, and logical value swapped versions of the given examples.

Figure 2:
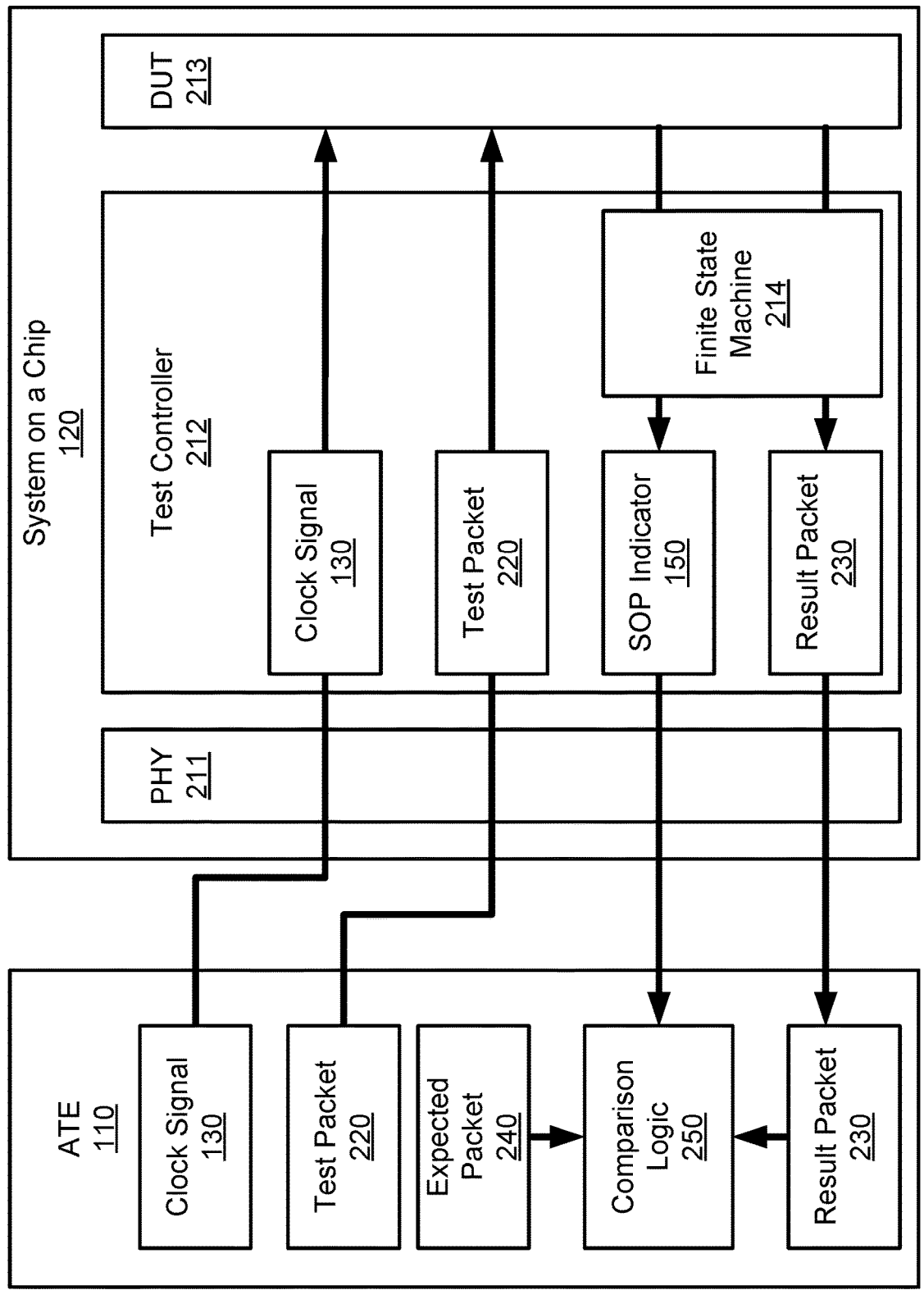
FIG. 2 illustrates a diagram of an example system for providing data transmission for test, according to embodiments of the present disclosure.

FIG. 2 illustrates a diagram of an example system for providing data transmission for test, according to embodiments of the present disclosure. The ATE 110 transmits the clock signal 130 and the test packet 220 (including the various logical inputs 140) to a physical layer (PHY) 211 of a system on a chip (SOC) 120 or other integrated circuit or wafer that includes the DUT 213. The SoC 120 includes a test controller 212 and the DUT 213. Circuitries of the test controller 212 and the DUT 213 reside on single substrate, i.e., the same piece of silicon. In other examples, the circuitry of the test controller 212 may reside remote from the DUT 213 on a different silicon device. The test controller 212 receives the clock signal 130 and the test packet 220 which are loaded into the DUT 213. In various embodiments, the test controller 212 performs various interpretation and de-packaging operations to interpret and provide the test packet 220 to the registers on the DUT 213. In various embodiments, the test controller 212 loads the data by shifting the received data onto the DUT 213.

A Finite State Machine (FSM) 214 in the test controller 212 includes various logical operations that manipulate the received data to produce a result packet 230 (including the various logical outputs 160) and an SOP indicator 150. The FSM 214 may perform various formatting operations on the data to package the data for transmission via the PHY 211 to the ATE 110. For example, when the ATE 110 desires data in different formats (different header lengths, certain values in different locations, different encapsulation, etc.) than as outputted from the DUT 213, the FSM 214 translates the output of the DUT 213 into a format desirable by the ATE 110. In a first example, the state FSM 214 receives no logical outputs and a clock signal from the DUT 213. Based on receipt of no logical outputs and a clock signal from the DUT 213, the FSM 213 outputs an SOP indicator 150 indicative that the logical outputs of the DUT 213 are not ready for comparison by the ATE 110, and does not transmit a result packet 220 to the ATE 100. The FSM 213 may set the SOP indicator 150 to low by gating the cycles of the clock that do not correspond to an output 160 generated by the DUT 213. In a second example, the state FSM 214 receives logical outputs 160 and the clock signal from the DUT 213. Based on receipt of the logical outputs 160 and a clock signal from the DUT 213, the FSM 213 outputs an SOP indicator 150 indicative that the logical outputs 160 of the DUT 213 are ready for comparison by the ATE 110, and correspondingly transmits a result packet 220 containing the logical outputs 160 based on the inputs 140 to the ATE 100. FSM 214 may be configured differently to provide the same functionality. For example, the FSM 214 may generate TRUE or FALSE values as the SOP indicators 150 based on receipt of the FSM 214 of logical outputs 160, where SOP=TRUE when logical outputs 160 are received, and SOP=FALSE when no logical outputs 160 are received, or vice versa.

The ATE 110 receives the result packet 230 from the SoC 120 and uses comparison logic 250 to compare the result packet 230 against an expected packet 240 associated with the initial test packet 220. The comparison logic 250 is gated based on the SOP indicator 150 so that the ATE 110 does not compare the expected packet 240 against data received (or not yet received) from the SoC 120. Stated differently, the SOP indicator 150 signals the comparison logic 250 when to begin the comparison between the expected packet 240 and the result packet 230 so that the ATE 110 is synchronized with the output from the DUT 213, thereby compensating for potential clock drift. The comparison logic 250 determines whether the logical values included in the result packet 230 match the logical values specified in the expected packet 240, and passes the DUT 213 when a match exists, and fails the DUT 213 when a match does not exist. The logical values specified in the expected packet 240 may reside in memory accessible to the ATE 110, such as a look-up table, library or other suitable database.

Figure 3:
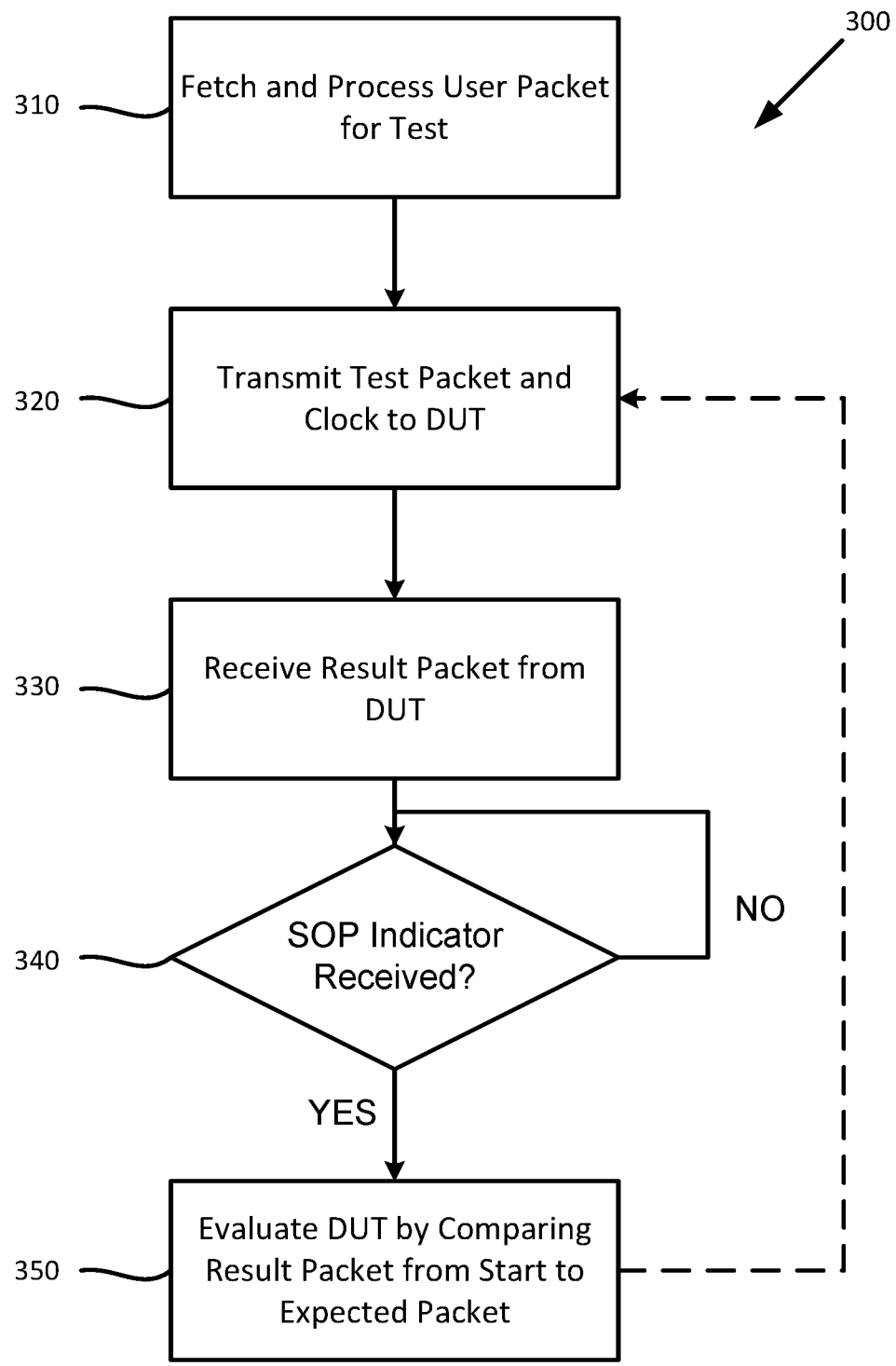
FIG. 3 is a flowchart of a method for synchronizing a DUT with the check cycle of ATE during test, according to embodiments of the present disclosure.

FIG. 3 is a flowchart of a method 300 for synchronizing a DUT 213 with the check cycle of an ATE 110 during test, according to embodiments of the present disclosure. Method 300 begins with 310, where the ATE 110 fetches and processes a test packet 220 suitable for use in testing a DUT 213. In some embodiments, where the test packet 220 has previously been used, the ATE 110 also fetches an associated expected packet 240 that a passing DUT 213 will produce in response to receiving the test packet 220. In other embodiments, where the test packet 220 has not been previously used or the expected packet 240 is otherwise not stored in memory, the ATE 110 determines the contents of the expected packet 240 and saves the expected packet 240 for later comparison against result packets 230 received from the DUT 213.

At 320, the ATE 110 transmits the test packet 220 and the clock signal 130 of the ATE 110 to the DUT 213. Depending on how the test packet 220 was processed for transmission (per 310), the DUT 213 (or a test controller 212 associated with the DUT 213) unpackages the test packet 220 for consumption by the DUT 213. In various embodiments, the test packet 220 and the clock signal 130 are scan shifted into the registers of a scan channel of the DUT 213 for processing according to an FSM 214 included in the test controller 212.

In various embodiments, the ATE 110 transmits the test packet 220 and the clock signal 130 to several DUTs 213 in sequence. For example, the ATE 110 transmits the test packet 220 and clock signal 130 to a first DUT (at 320) at a first time, and the ATE 110 transmits the test packet 220 and clock signal 130 (at 320) to the second DUT at a second time, where the second time is later than the first time (e.g., after the ATE 110 evaluates the first DUT, at 350). In other embodiments, the ATE 110 transmits the test packet 220 and the clock signal 130 to several DUTs 213 in parallel so that method 300 is performed to evaluate several DUTs 213 at substantially the same time and account for any clock drift therein.

At 330, the ATE 110 receives a result packet 230 from the DUT 213. In various embodiments, the DUT 213 (or an associated test controller 212) packages variously the result packet 230 for transmission to the ATE 110, and the ATE 110 may variously process or remove data from the result packet 230 before analysis (e.g., removing header information, ensuring a payload matches a checksum).

At 340, the ATE 110 determines whether the SOP indicator 150 has been received from the DUT 213. When the SOP indicator 150 has not yet been received, method 300 remains at 340 until the SOP indicator 150 is received or a timeout condition occurs. When the SOP indicator 150 is received, method 300 proceeds to 350. The ATE 110 uses the SOP indicator 150 to gate the conditional comparison logic 250; beginning the comparison between the expected packet 240 and the result packet 230 in response to receiving the SOP indicator 150. Stated differently, the ATE 110 may receive the result packet 230 and delay evaluating the result packet 230 against the expected packet 240 until the ATE 110 receives the SOP indicator 150 from the DUT 213.

When several DUTs 213 are tested in parallel, not every result packet 230 may be received at the same time, due to transmission delays, clock drift, or the like. Accordingly, the ATE 110 gates the conditional comparison logic 250 for comparing the result packet 230 to the expected packet 240 based on whether an SOP indicator 150 for the associated DUT 213 has been received. Therefore, method 300 may proceed to 350 from 340 at different times for different DUTs 213 that are experiencing clock drift relative to one another.

At 350, in response to receiving a SOP indicator 150 per 340, the ATE 110 evaluates the DUT 213 by comparing the result packet 230 from the start of the result packet 230 (as indicated by the presence of the SOP indicator 150) to the expected packet 240. In various embodiments, the evaluation is a bitwise comparison of the packets, or a subset thereof. In response to the contents of the result packet 230 matching the contents of the expected packet 240, the ATE 110 marks the DUT 213 as passing test. In response to the contents of the result packet 230 not matching the contents of the expected packet 240, the ATE 110 marks the DUT 213 as failing test.

Stated differently, the ATE 110 is able to adjust the time window in which various DUTs 213 are evaluated based on the individual processing and transmission times of those DUTs 210 according to the associated SOP indicator 150. Accordingly, the result packets from the DUTs 213 are evaluated during the adjusted time window, some of which may pass test that would have failed test if evaluated during the original (unadjusted) time window, and some of which may fail test that would have passed test if evaluated during the original (unadjusted) time window. The improvements provided to the underlying ATE 110 and DUTs 213 by method 300 therefore include the ability to mitigate false-positive and false-negatives due to clock desynchronization when evaluating DUTS 213.

In embodiments where the ATE 110 sequentially tests several DUTs 213, method 300 may repeat from 320 for the subsequent DUT 213. Otherwise, when all of the DUTs 213 have undergone test, method 300 may conclude.

Figure 4:
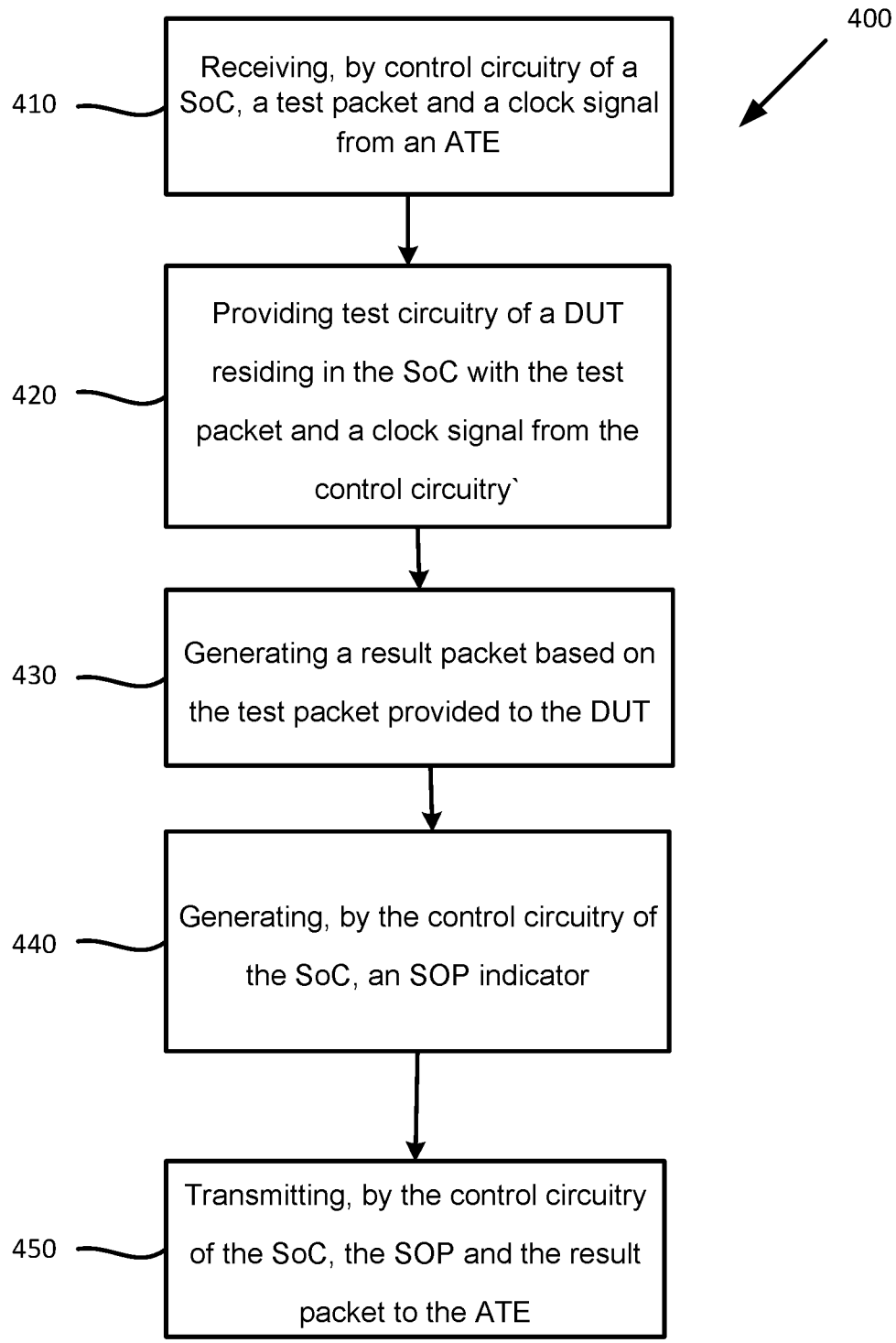
FIG. 4 is a flowchart of a method for testing a SoC having control circuitry for synchronizing with an ATE during test, according to embodiments of the present disclosure.

FIG. 4 is a flowchart of a method 400 for testing a SoC 120 having control circuitry for synchronizing with an ATE 110 during test, according to embodiments of the present disclosure. Method 400 begins with 410, where the SoC 120 receives a test packet 220 and a clock signal 130 from the ATE 110. The test packet 220 is suitable for use testing a DUT 213 residing on the SoC 120.

At 420, the control circuitry of the SoC 120 provides test circuitry of the DUT 213 with the test packet 220 and a clock signal. The clock signal may be any of the clock signals 130 described above.

At 430, the DUT 213 generates a result packet 230 based on the test packet 220. The DUT 213 also returns the clock signal to the control circuitry of the SoC 120.

At 440, the control circuitry of the SoC 120 generates an SOP indicator 150. The SOP indicator 150 is indicative of the readiness of the output 160 of the DUT 213 for evaluation by the ATE 110. As discussed above, the SOP indicator 150 may be indicative that the present cycle of the clock be skipped as the output 160 of the DUT 213 is not present or complete: or that the output 160 of the DUT is present and ready for evaluation by the ATE 110. In some examples, the output of the SOP indicator 150 is determined using a FSM 214 as described above.

At 450, the control circuitry of the SoC 120 transmits the SOP 150 and the result packet 230 to the ATE 110. Since the SOP 150 provided by the SoC 102 informs the ATE 110 that the data transmitted, e.g., the result packet 230, is read for testing, the ATE 110 remains fully synchronized with the DUT 213 so that false failure results are not generated due to mismatches in clock timing. This also enables a single ATE 110 to be cost effectively utilized with many different types of SoCs 120 while enabling more accurate product yields, thus lowering both the cost of ownership for the ATE and the cost of SoC manufacturing.

Figure 5:
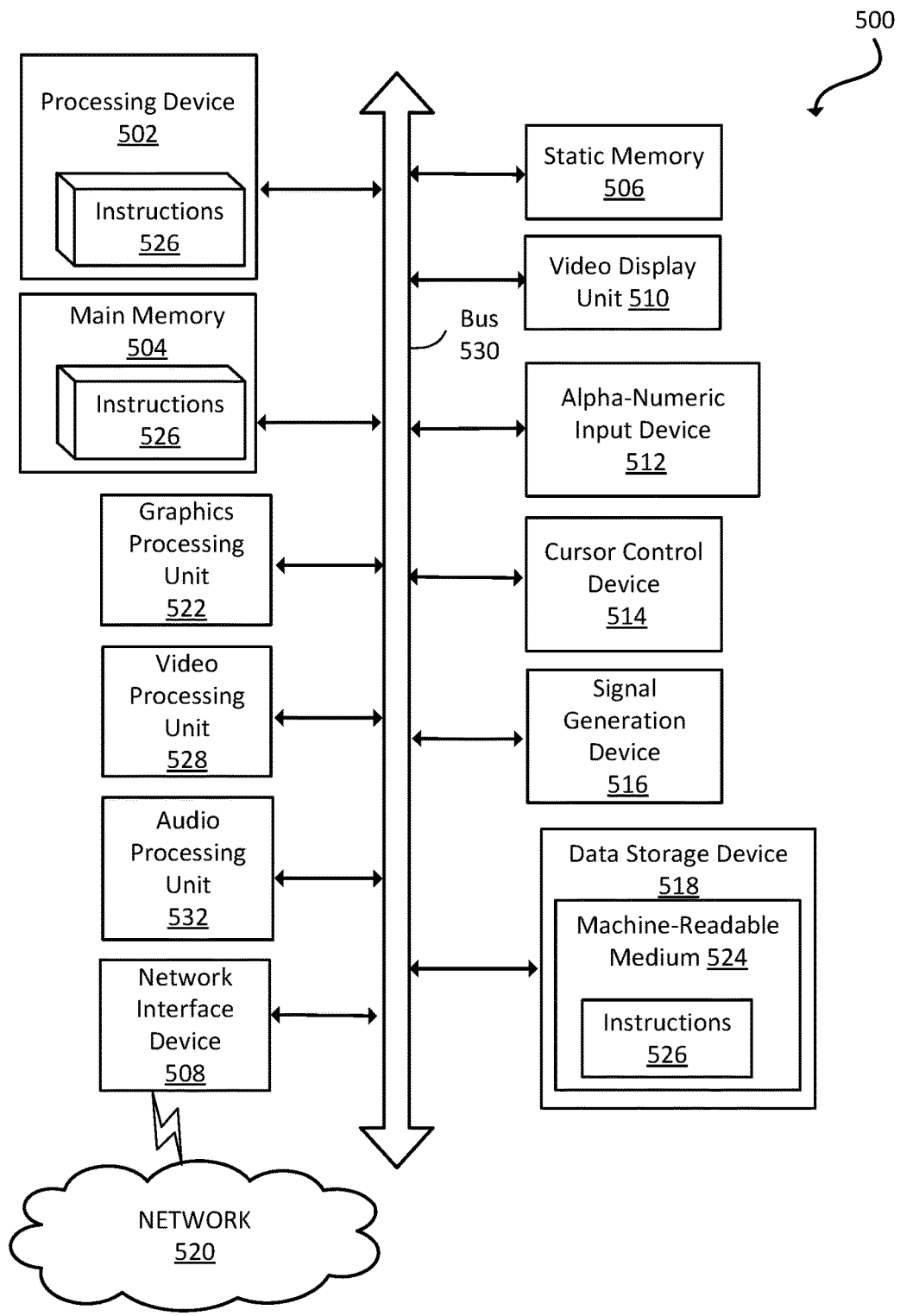
FIG. 5 illustrates an example machine of a computer system within which a set of instructions, for causing the machine to perform any one or more of the methodologies discussed herein, may be executed, according to embodiments of the present disclosure.

FIG. 5 illustrates an example machine of a computer system 400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
    transmitting a test packet and a clock signal from an automated test equipment (ATE) to a first device under test (DUT), wherein the first DUT processes the test packet based on the clock signal;
    receiving, at the ATE from the first DUT, a result packet; and
    in response to receiving a start of packet (SOP) indicator from the first DUT at the ATE, evaluating the first DUT by comparing the result packet to an expected packet associated with the test packet, wherein the SOP indicator is based on a response clock for the first DUT.

2. The method of claim 1, further comprising:
    transmitting the test packet and the clock signal from the ATE to a second DUT;
    receiving, at the ATE from the second DUT, a second result packet; and
    in response to receiving a second SOP indicator from the second DUT at the ATE, evaluating the second DUT by comparing the second result packet to the expected packet.

3. The method of claim 1, further comprising:
    transmitting, in parallel to transmitting the test packet and the clock signal from the ATE to the first DUT, the test packet and the clock signal from the ATE to a second DUT;
    receiving, from the second DUT at the ATE, a second result packet at a different time than when the result packet is received from the first DUT at the ATE; and
    in response to receiving a second SOP indicator from the second DUT at the ATE, evaluating the second DUT by comparing the second result packet to the expected packet.

4. The method of claim 1, further comprising:
    scan shifting the test packet and the clock signal into registers of a scan channel of the first DUT.

5. The method of claim 1, wherein the response clock is asynchronous to the clock signal.

6. The method of claim 1, further comprising:
    based on the result packet containing an output of the first DUT based on the test packet, setting the SOP to one of logical TRUE or FALSE; and
    based on the result packet not containing the output of the first DUT based on the test packet, setting the SOP to the other of the logical TRUE or FALSE.

7. The method of claim 1, further comprising:
    gating comparison logic in the ATE for comparing the result packet to the expected packet based on the SOP indicator.

8. The method of claim 1, further comprising:
    fetching and processing the test packet for transmission to the first DUT; and
    in response to the expected packet not being included in memory, generating and storing the expected packet based on the test packet.

9. A system, comprising:
    a processor; and
    a memory storing instructions that when executed by the processor cause the processor to:
        transmit a test packet from an automated test equipment (ATE) to a device under test (DUT);
        transmit a clock signal from the ATE to the DUT;
        receive, at the ATE, a result packet from the DUT;
        delay evaluation of the result packet until the ATE receives a start of packet (SOP) indicator from the DUT, wherein the SOP indicator is transmitted separately from the result packet by the DUT to the ATE; and
        evaluate the DUT by comparing the result packet to an expected packet associated with the test packet starting when indicated by the SOP indicator.

10. The system of claim 9, wherein the SOP indicator is based on an asynchronous response clock for the DUT processing the test packet.

11. The system of claim 9, wherein the instructions when executed by the processor further cause the processor to, in response to the result packet matching the expected packet, pass the DUT when the DUT would have failed if the result packet had been evaluated when received.

12. The system of claim 9, wherein the instructions when executed by the processor further cause the processor to, in response to the result packet not matching the expected packet, fail the DUT when the DUT would have passed if the result packet had been evaluated when received.

13. The system of claim 9, wherein the instructions when executed by the processor further cause the processor to, after evaluating the DUT:
    transmit, after transmitting the test packet and the clock signal to the DUT, the test packet and the clock signal from the ATE to a second DUT;
    receive, at the ATE from the second DUT, a second result packet; and
    in response to receiving a second SOP indicator from the second DUT at the ATE, evaluating the second DUT by comparing the second result packet to the expected packet.

14. The system of claim 9, wherein the instructions when executed by the processor further cause the processor to:
  transmit, in parallel to transmitting the test packet and the clock signal from the ATE to the DUT, the test packet and the clock signal from the ATE to a second DUT;
  receive, at the ATE from the second DUT, a second result packet at a different time than when the result packet is received from the DUT at the ATE; and
  delay evaluation of the second result packet until the ATE receives a second SOP indicator from the second DUT, wherein the second SOP indicator is transmitted separately from the second result packet by the second DUT to the ATE; and
  evaluate the second DUT by comparing the result packet to the expected packet.

15. The system of claim 9, wherein the instructions when executed by the processor further cause the processor to:
  scan shift the test packet and the clock signal into registers of a scan channel of the DUT.

16. The system of claim 9, wherein the instructions when executed by the processor further cause the processor to:
  fetch and process the test packet for transmission to the DUT; and
  in response to the expected packet not being included in memory, generating and storing the expected packet based on the test packet.

17. An integrated circuit comprising:
control circuitry; and
test circuitry communicatively coupled to the control circuitry on a common substrate, the control circuitry configured to:
  receive a test packet and a clock signal from an automated test equipment (ATE);
  provide the test circuitry with the test packet and the clock signal, wherein the test circuitry is of a device under test (DUT) that is associated with the control circuitry;
  generate a result packet based on the test packet provided to the DUT;
  generate a start of packet (SOP) indicator; and
  transmit the SOP and the result packet to the ATE.

18. The integrated circuit of claim 17, wherein the test circuitry and the control circuitry reside on a common wafer or a common system-on-chip (SoC).

19. The integrated circuit of claim 17, wherein the control circuitry further comprises:
  a finite state machine configured to have a first state indicative of the result packet being ready for analysis by the ATE and a second state indicative of the result packet not being ready for analysis by the ATE.

* * * * *